(12) United States Patent
Chang et al.

(10) Patent No.: US 8,330,146 B2
(45) Date of Patent: Dec. 11, 2012

(54) ORGANIC PHOTODETECTOR

(75) Inventors: Tzu-Yueh Chang, Taichung County (TW); Po-Tsung Lee, Hsinchu County (TW); Szu-Yuan Chen, Taipei County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 641 days.

(21) Appl. No.: 11/779,895

(22) Filed: Jul. 19, 2007

(65) Prior Publication Data
US 2008/0277650 A1 Nov. 13, 2008

(30) Foreign Application Priority Data
May 7, 2007 (TW) .............................. 96116120 A

(51) Int. Cl.
*H01L 31/042* (2006.01)
(52) U.S. Cl. .................... 257/40; 257/114; 257/293
(58) Field of Classification Search .............. 257/59, 257/82, 223, 292, 40, 114, 186, 293, 79, 257/98, 431–436, 461, 294, 258, 208.1, 288, 257/289, E31.058, E31.115, E27.133, E25.032, 257/E31.121, E31.122, E33.068, E33.073, 257/E33.077, E33.076, E31.087, E31.088; 359/619, 620, 621, 622, 623; 427/64; 136/263
See application file for complete search history.

(56) References Cited

U.S. PATENT DOCUMENTS

| | | | |
|---|---|---|---|
| 5,872,355 A * | 2/1999 | Hueschen | 250/208.1 |
| 6,506,616 B1 * | 1/2003 | Kim et al. | 438/22 |
| 6,509,574 B2 * | 1/2003 | Yuan et al. | 250/551 |
| 6,972,431 B2 | 12/2005 | Forrest et al. | |
| 2002/0003201 A1 * | 1/2002 | Yu | 250/208.1 |
| 2002/0017612 A1 * | 2/2002 | Yu et al. | 250/370.11 |
| 2003/0207500 A1 * | 11/2003 | Pichler et al. | 438/127 |
| 2005/0098878 A1 * | 5/2005 | Yu et al. | 257/706 |
| 2005/0112881 A1 * | 5/2005 | Prakash et al. | 438/689 |
| 2005/0248261 A1 * | 11/2005 | Hubert et al. | 313/500 |
| 2006/0027834 A1 * | 2/2006 | Forrest et al. | 257/183 |
| 2007/0048892 A1 * | 3/2007 | Wadell et al. | 438/82 |
| 2007/0181944 A1 * | 8/2007 | Macpherson et al. | 257/344 |

FOREIGN PATENT DOCUMENTS

| | | |
|---|---|---|
| TW | 550964 | 9/2003 |
| TW | I236173 | 7/2005 |
| TW | I278133 | 4/2007 |

OTHER PUBLICATIONS

"Office Action of Taiwan Counterpart Application", issued on Feb. 22, 2011, p. 1-p. 4.

* cited by examiner

*Primary Examiner* — Cuong Q Nguyen
*Assistant Examiner* — Yosef Gebreyesus
(74) *Attorney, Agent, or Firm* — Jianq Chyun IP Office

(57) ABSTRACT

An organic photodetector including a substrate, a first electrode, an insulation layer, an organic layer, and a second electrode is provided. The first electrode is disposed on the substrate. The insulation layer is disposed on the first electrode. The organic layer is disposed on the substrate and the insulation layer and covers a side surface of the insulation layer and a side surface of the first electrode. The second electrode is disposed on the organic layer and located above the insulation layer.

10 Claims, 2 Drawing Sheets

ORGANIC PHOTODETECTOR

CROSS-REFERENCE TO RELATED APPLICATION

This application claims the priority benefit of Taiwan application serial no. 96116120, filed May 7, 2007. All disclosure of the Taiwan application is incorporated herein by reference.

BACKGROUND OF THE INVENTION

1. Field of the Invention

The present invention is related to a photodetector and a fabricating method thereof, and particularly to an organic photodetector and a fabricating method of an organic photodetector and an organic thin film transistor (OTFT).

2. Description of Related Art

Photodetectors can be divided into inorganic photodetectors and organic photodetectors according to their different materials. Inorganic photodetectors have been extensively applied in many things, such as the charge-coupled device (CCD), the complementary metal-oxide semiconductor (CMOS) and the sensing component. In contrast to the inorganic photodetector, the organic photodetector has better characteristics than those of the inorganic photodetector, such as flexibility, low fabricating temperature and so forth.

FIG. 1 illustrates a schematic cross-sectional view of a conventional organic photodetector. Referring to FIG. 1, an organic photodetector 100 includes a transparent substrate 110, an anode 120, an organic layer 130, a stop layer 140 and a cathode 150. When photons carrying enough energy enter the organic layer 130 from the substrate 110, the organic layer 130 would absorb the photons to form electron-hole pairs. Holes in the electron-hole pairs move towards the cathode 150 and the electrons move towards the anode 120 so that opto-electric currents are generated. Detection of the opto-electric currents can determine if there is any light entering the organic layer 130.

If the organic photodetector detects any light, an incident light needs to enter the organic layer so as to generate the opto-electric currents. The larger an irradiated area in the organic layer is, the higher the sensibility of the organic photodetector gets. Therefore, how to increase the irradiated area to improve the efficiency of the organic photodetector has become an important issue.

SUMMARY OF THE INVENTION

The present invention is directed to an organic photodetector having a larger irradiated area.

The invention is also directed to an organic photodetector and a fabricating method of the organic photodetector and an organic thin film transistor (OTFT) so as to form an organic photodetector and an OTFT simultaneously.

As embodied or broadly described herein, the invention is directed to an organic photodetector including a substrate, a first electrode, an insulation layer, an organic layer and a second electrode. The first electrode is disposed on the substrate. The insulation layer is disposed on the first electrode. The organic layer is disposed on the substrate and the insulation layer and covers the insulation layer and a side surface of the first electrode. The second electrode is disposed on the organic layer and located above the insulation layer.

According to one embodiment of the invention, the first electrode is an anode and the second electrode is a cathode.

According to one embodiment of the invention, the first electrode is a cathode and the second electrode is an anode.

In one embodiment of the invention, the second electrode is a transparent electrode.

In one embodiment of the invention, the material of the second electrode includes indium tin oxide (ITO).

In one embodiment of the invention, the second electrode is a metal electrode and the thickness of the second electrode is smaller than 100 nanometers.

In one embodiment of the invention, the second electrode is a metal electrode.

In one embodiment of the invention, the first electrode is a metal electrode.

In one embodiment of the invention, the material of the organic layer includes pentacene.

In one embodiment of the invention, the material of the insulation layer includes silicon oxide, silicon nitride, or silicon dioxide.

As embodied or broadly described herein, the invention provides a fabricating method of an organic photodetector and an organic thin film transistor (OTFT) including the following steps. First, a first electrode and a gate are formed on a substrate. Next, a first insulation layer is formed on the first electrode, and a second insulation layer is formed on the gate. The second insulation layer further covers a side surface of the gate. Afterwards, a first organic layer is formed on the substrate and the first insulation layer, and a second organic layer is formed on the second insulation layer. The first organic layer further covers the first insulation layer and a side surface of the first electrode. Then, a second electrode is formed on the first organic layer, and a source/drain is formed on the second organic layer. The second electrode is located above the first insulation layer.

According to one embodiment of the invention, the first electrode is an anode and the second electrode is a cathode.

In one embodiment of the invention, the second electrode is a transparent electrode.

In one embodiment of the invention, the second electrode is a metal electrode and the thickness of the second electrode is smaller than 100 nanometers.

In one embodiment of the invention, the second electrode is a metal electrode.

In one embodiment of the invention, the first electrode is a metal electrode.

In one embodiment of the invention, the materials of the first organic layer and the second organic layer include pentacene.

In one embodiment of the invention, the materials of the first insulation layer and the second insulation layer include silicon oxide, silicon nitride or silicon dioxide.

The organic layer of the organic photodetector of the invention covers a side surface of the insulation layer and a side surface of the first electrode, and therefore has a greater irradiated area and a higher sensitivity. Additionally, the fabricating process of the organic photodetector of the invention can be integrated with that of the OTFT, so that an organic photodetector and an OTFT can be formed simultaneously and thereby saving the fabricating cost.

In order to the make the aforementioned and other objects, features and advantages of the present invention more comprehensible, preferred embodiments accompanied with figures are described in detail below.

DESCRIPTION OF EMBODIMENTS

The First Embodiment

Figure 1:
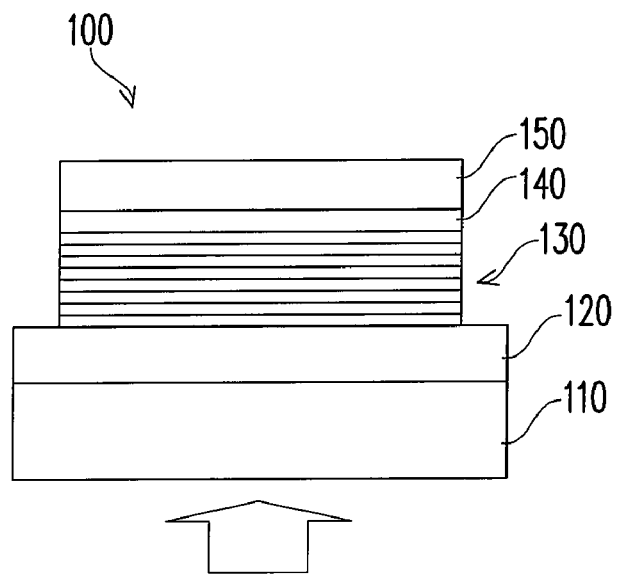
FIG. 1 illustrates a schematic cross-sectional view of a conventional organic photodetector.
Figure 2:
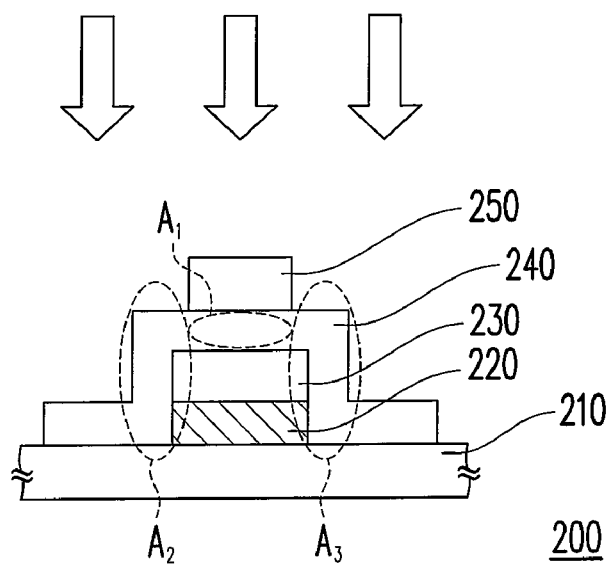
FIG. 2 illustrates a schematic cross-sectional view of the organic photodetector according to the first embodiment of the present invention.

FIG. 2 illustrates a schematic cross-sectional view of the organic photodetector according to the first embodiment of the present invention. Referring to FIG. 2, an organic photodetector 200 includes a substrate 210, a first electrode 220, an insulation layer 230, an organic layer 240 and a second electrode 250. The first electrode 220 is disposed on the substrate 210. The insulation layer 230 is disposed on the first electrode 220. The organic layer 240 is disposed on the substrate 210 and the insulation layer 230 and covers the insulation layer 230 and a side surface of the first electrode 220. The second electrode 250 is disposed on the organic layer 240 and located above the insulation layer 230. The organic layer 240 and the substrate 210 together define an enclosed receiving space receiving the first electrode 220 and the insulation layer 230 therein.

In view of the above, when a light strikes the organic photodetector 200, the organic layer 240 absorbs photons to form electron-hole pairs. Electrons and holes are affected by electric fields of the first electrode 220 and the second electrode 250, and move towards either the first electrode 220 or the second electrode 250 respectively. More specifically, when the first electrode 220 is an anode and the second electrode 250 is a cathode, the holes move towards the second electrode 250 and the electrons move towards the first electrode 220. When the first electrode 220 is a cathode and the second electrode 250 is an anode, the electrons move towards the second electrode 250 and the holes move towards the first electrode 220. The moving of the electrons and the holes generates opto-electric currents. Detection of such opto-electric currents may obtain an intensity of a light irradiating the organic layer 240.

Since the organic layer 240 covers the side surface of the insulation layer 230 and the side surface of the first electrode 220, and the insulation layer 230 is disposed between the first electrode 220 and the organic layer 240, the opto-electric currents generated after the organic layer 240 is irradiated would flow between the first electrode 220 and the second electrode 250 through areas A2 and A3. A portion of the organic layer 240 located in the areas A2 and A3 can all be irradiated, and thus the organic photodetector 200 of the present embodiment has a larger irradiated area so that the sensitivity of the organic photodetector 200 is improved. Furthermore, a performance of the organic photodetector 200 is modulated by adjusting a thickness of the insulation layer 230 in the present embodiment so as to control a length of a transmission path of the electrons and the holes.

In the organic photodetector 200, when the first electrode 220 is an anode and the second electrode 250 is a cathode, the first electrode 220 and the second electrode 250 can be metal electrodes. Further, a work function of the material of the first electrode 220 is larger than that of the material of the second electrode 250. For example, the material of the first electrode 220 may be gold, and the material of the second electrode 250 may be aluminum or silver. In addition, in order to further increase the irradiated area of the organic photodetector 200, the second electrode 250 may be a transparent electrode, so that a portion of the organic layer 240 in an area A1 can also be irradiated. The transparent electrode is a metal electrode having a thickness, for example, smaller than 100 nanometers.

When the first electrode 220 is a cathode and the second electrode 250 is an anode, the first electrode 220 and the second electrode 250 may be metal electrodes. Further, the work function of the material of the second electrode 250 is larger than that of the material of the first electrode 220. Additionally, in order to further increase the irradiated area of the organic photodetector 200, the second electrode 250 can be a transparent electrode, so that a portion of the organic layer 240 in the area A1 can also be irradiated. The transparent electrode is a metal electrode having a thickness, for example, smaller than 100 nanometers. Alternatively, the transparent electrode may also be fabricated using a transparent material such as indium tin oxide (ITO).

Moreover, the material of the substrate 210 is, for example, silicon dioxide, and the material of the organic layer 240 may be pentacene. The material of the insulation layer 230 may be silicon oxide, silicon nitride or silicon dioxide, but not limited to these.

The organic photodetector 200 can be applied to an organic thin film transistor (OTFT) array substrate. More specifically, since opto-electric currents are generated when an OTFT is irradiated, the characteristics of a drain current to a drain voltage in the OTFT are changed so as to cause photo-leakage currents. In order to improve the aforesaid situation, the organic photodetector 200 can be disposed surrounding the OTFT array substrate, or an organic photodetector 200 can be disposed adjacent to each of the OTFTs. Hence, the intensity of the incident light can be detected by the organic photodetector 200 and a peripheral circuit around the OTFT array substrate can compensate the characteristics of the drain current to the drain voltage in the OTFT according to a detection result of the organic photodetector 200 and thereby mitigating the problem of photo-leakage currents.

It should be noted that the organic photodetector 200 of the present embodiment can be manufactured along with the OTFT. One embodiment is cited in the following to disclose the fabricating method of the organic photodetector and the OTFT in the present invention.

The Second Embodiment

FIGS. 3A through 3D illustrate schematic flowcharts of the fabricating process of the organic photodetector and the OTFT according to the second embodiment of the invention. It should be pointed out first that the same or similar reference numerals or labels represent the same or similar components in the second and the first embodiments.

Figure 3A:
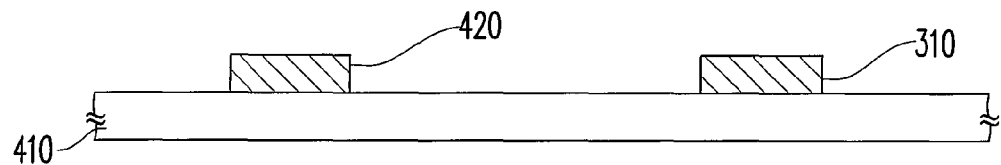
FIGS. 3A through 3D illustrate schematic flowcharts of the fabricating process of the organic photodetector and the OTFT according to the second embodiment of the invention.

The fabricating method of the organic photodetector and the OTFT in the present embodiment includes the following steps. First, as illustrated in FIG. 3A, a first electrode 420 and a gate 310 are formed on a substrate 410. The method of forming the first electrode 420 and the gate 310 can be a normal photolithography process and an etching process, which means a thin film (not illustrated) is deposited on the substrate 410 and then the thin film is patterned to form the first electrode 420 and the gate 310. The material of the substrate 410 is, for example, silicon dioxide, and the materials of the first electrode 420 and the gate 310 may be metals. The metals can be gold but not limited to this. In addition, the first electrode 420 may serve as an anode.

Figure 3B:
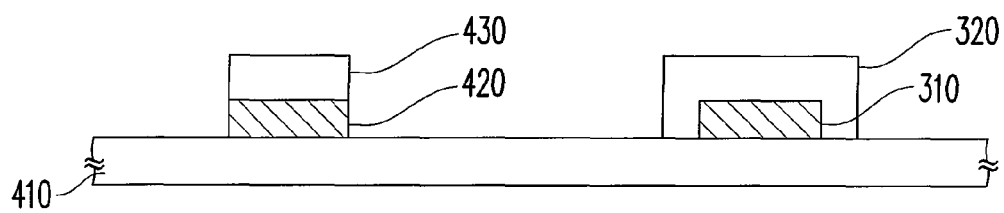

Afterwards, as illustrated in FIG. 3B, a first insulation layer 430 is formed on the first electrode 420 and a second insulation layer 320 is formed on the gate 310. The second insulation layer 320 covers a side surface of the gate 310. The method of forming the first insulation layer 430 and the second insulation layer 320 is first, for example, forming an insulation material layer, and then patterning the insulation material layer so as to form the first insulation layer 430 and the second insulation layer 320. Additionally, the materials of the first insulation layer 430 and the second insulation layer 320 may be silicon oxide, silicon nitride or silicon dioxide.

Figure 3C:
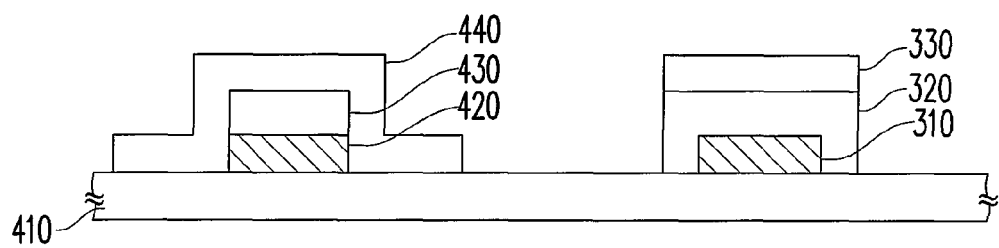

Thereafter, as illustrated in FIG. 3C, a first organic layer 440 is formed on the substrate 410 and the first insulation layer 430, and a second organic layer 330 is formed on the second insulation layer 320. The first organic layer 440 further covers a side surface of the first insulation layer 430 and a side surface of the first electrode 420. The method of forming the first organic layer 440 and the second organic layer 330 is first, for example, adding a patterned mask on the substrate 410, and then performing an organic thin film deposition process to form the first patterned organic layer 440 and the second patterned organic layer 330. In the present embodiment, a thin film deposition process can be performed first to form an organic thin film and then the organic thin film is patterned with an organic solvent to form the first organic layer 440 and the second organic layer 330. Further, the materials of the first organic layer 440 and the second organic layer 330 may be pentacene.

Figure 3D:
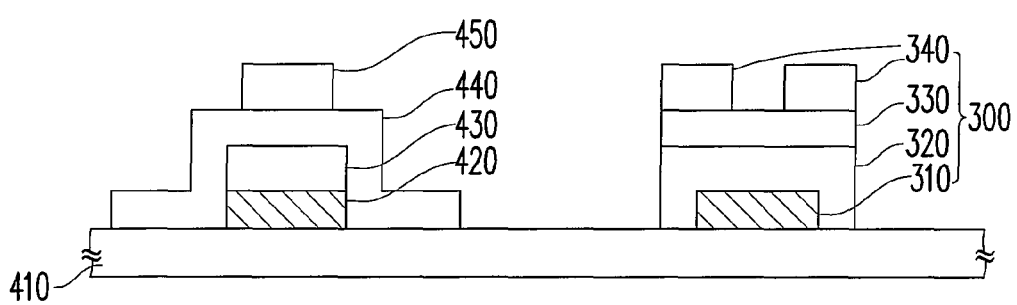

Thereafter, as illustrated in FIG. 3D, a second electrode 450 is formed on the first organic layer 440 and a source/drain 340 is formed on the second organic layer 330. The second electrode 450 is located above the first insulation layer 430. The method of forming the second electrode 450 and the source/drain 340 can apply a normal photolithography process and an etching process. Moreover, the materials of the second electrode 450 and the source/drain 340 may be metals, such as silver or aluminum and the like, but not limited to these. The second electrode 450 may be used as a cathode. Additionally, in order to further increase an irradiated area, a thickness of the second electrode 450 can be smaller than 100 nanometers so that the second electrode 450 is rendered transparent.

Since the aforementioned fabricating method integrates the fabricating process of the organic photodetector with the that of the OTFT, an organic photodetector and an OTFT can be formed simultaneously and thereby saving the fabricating cost.

In summary, the present invention at least has the following advantages:

1. The organic photodetector of the invention has a larger irradiated area and a higher sensibility since the organic layer covers the side surface of the insulation layer and the side surface of the first electrode.

2. The performance of the organic photodetector is modulated by adjusting the thickness of the insulation layer to control the length of the transmission path of the electrons and the holes.

3. The fabricating process of the organic photodetector can be integrated with that of the OTFT, so that an organic photodetector and an OTFT can be formed simultaneously and thereby saving the fabricating cost.

Although the present invention has been disclosed above by the embodiments, they are not intended to limit the present invention. Anybody ordinarily skilled in the art can make some modifications and alterations without departing from the spirit and scope of the present invention. Therefore, the protecting range of the present invention falls in the appended claims.

What is claimed is:

1. An organic photodetector comprising:
    a substrate;
    a first electrode disposed on the substrate;
    an insulation layer disposed on the first electrode, wherein the first electrode and the insulating layer are entirely overlapped with each other;
    an organic layer for forming electron-hole pairs as absorbing the photons disposed on the substrate and the insulation layer and having sidewall portions covering side surfaces of the insulation layer and the first electrode; and
    a second electrode disposed on the organic layer and exposing the sidewall portions of the organic layer and exposing at least a portion of the organic layer disposed on the substrate.

2. The organic photodetector of claim 1, wherein the first electrode is an anode and the second electrode is a cathode.

3. The organic photodetector of claim 1, wherein the first electrode is a cathode and the second electrode is an anode.

4. The organic photodetector of claim 1, wherein the second electrode is a transparent electrode.

5. The organic photodetector of claim 4, wherein a material of the second electrode comprises indium tin oxide (ITO).

6. The organic photodetector of claim 4, wherein the second electrode is a metal electrode and a thickness of the second electrode is smaller than 100 nanometers.

7. The organic photodetector of claim 1, wherein the second electrode is a metal electrode.

8. The organic photodetector of claim 1, wherein the first electrode is a metal electrode.

9. The organic photodetector of claim 1, wherein a material of the organic layer comprises pentacene.

10. The organic photodetector of claim 1, wherein a material of the insulation layer comprises silicon oxide, silicon nitride or silicon dioxide.

* * * * *